United States Patent [19]

Matsushima et al.

[11] 3,740,659

[45] June 19, 1973

[54] AC AMPLIFIER SYSTEM

[75] Inventors: Hiroshi Matsushima, Osaka; Ichiro Arimura, Kyoto; Hiroshi Goto, Osaka; Yoshikazu Nakao, Hirakata; Hazime Oziro, Takeda, all of Japan

[73] Assignee: Matsushita Electric Industrial Co., Ltd., Osaka, Japan

[22] Filed: Aug. 27, 1971

[21] Appl. No.: 175,621

[52] U.S. Cl. .................... 330/25, 330/30 D, 330/85

[51] Int. Cl. .................... H03g 3/30

[58] Field of Search .................... 330/25, 30 D, 69, 330/85, 9, 149

[56] References Cited

UNITED STATES PATENTS

| | | | |
|---|---|---|---|
| 3,070,786 | 12/1962 | MacIntyre | 330/9 X |
| 3,237,116 | 2/1966 | Skinner et al. | 330/9 |
| 3,241,082 | 3/1966 | Van Ligten et al. | 330/25 X |
| 2,896,031 | 7/1959 | Young | 330/85 X |
| 3,597,696 | 8/1971 | Rabindran | 330/9 X |
| 3,237,117 | 2/1966 | Collings et al. | 330/9 |

*Primary Examiner*—Roy Lake
*Assistant Examiner*—James B. Mullins
*Attorney*—Stevens, Davis, Miller & Mosher

[57] ABSTRACT

An AC amplifier system which comprises an all-stage direct coupling type AC amplifier and a negative feedback circuit connected across the all-stage direct coupling type AC amplifier which includes a DC amplifier connected to the output side of the AC amplifier and designed such that the drift and offset involved therein are extremely small compared to that of the AC amplifier, the DC amplifier having a voltage amplification degree greater than unity for a DC and super-low frequency range, the output of the DC amplifier being coupled to the input side of the AC amplifier for the negative feedback of part of the output of the AC amplifier, thereby greatly reducing the drift and offset of the AC amplifier system.

6 Claims, 4 Drawing Figures

AC AMPLIFIER SYSTEM

This invention relates to AC amplifier systems.

In recent days, audio power amplifiers as typical examples of the AC amplifier, to which the invention is particularly directed, predominantly adopt all-stage direct coupling type circuits. This is because all-stage direct coupling type power amplifiers can usually provide excellent AC characteristics in the aspects of distortion factor, frequency characteristics, rated output and stability. These types of power amplifiers, however, encounter such problems as 1/f noise for a super-low frequency range and drift and offset in the output.

When the output of power amplifiers involves drift and offset, DC current is caused to flow into the voice coil of the speaker (dynamic speaker) connected as the load to the output side of the amplifier. This will result in the deviation of the normal operating point of the speaker voice coil, reduction of the dynamic range of the speaker and an undesirable heating of the voice coil due to an unnecessary supply of power. Further, this will cause a bad influence on bias voltages for amplifier elements in the case of all-stage direct coupling type AC amplifier. Therefore, it is required to minimize the offset and drift.

In the usual direct coupling type audio power amplifier, however, such offset and drift are reduced only with sacrifice in distortion factor and frequency characteristics. As an example, even with a direct coupling type audio power amplifier using a differential amplifier comparatively very stable against drift in the first stage, there are limitations in reducing fluctuations in the circuit constants of individual circuit elements constituting the differential amplifier, so that the effect of the drift due to a temperature change becomes appreciable.

An object of the invention is to reduce the super-low frequency noise and offset and drift in the output of the AC amplifier without sacrificing the AC characteristics such as frequency characteristics and distortion by selectively amplifying the DC and super-low frequency components in the output of the AC amplifier and by negatively feeding back these amplified components to the input side of the AC amplifier.

Another object of the invention is to use a differential amplifier or chopper amplifier designed to be subject to sufficiently small drift for the amplifying circuit selectively amplifying the DC and super-low frequency components in the output of the AC amplifier for the negative feedback to the input side of the AC amplifier.

According to the present invention there is provided an AC amplifier system comprising an AC amplifier proper to amplify AC signals, and a negative feedback circuit connected across said AC amplifier, said negative feedback circuit including a DC amplifier designed such that the drift and offset involved therein are extremely small compared to the drift and offset in said AC amplifier.

The above and other objects, features and advantages of the present invention will become more apparent from the following description in connection with the accompanying drawings, in which.

Figure 1:
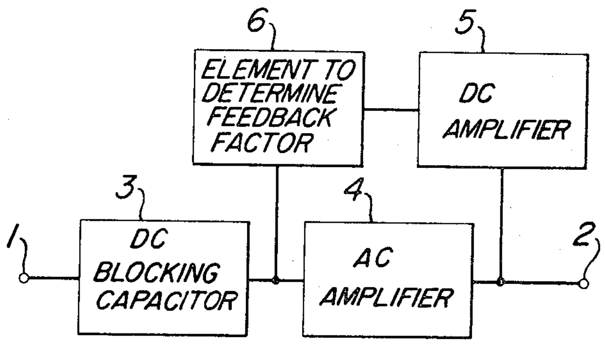
FIG. 1 is a block diagram showing the fundamental construction according to the invention.
Figure 3:
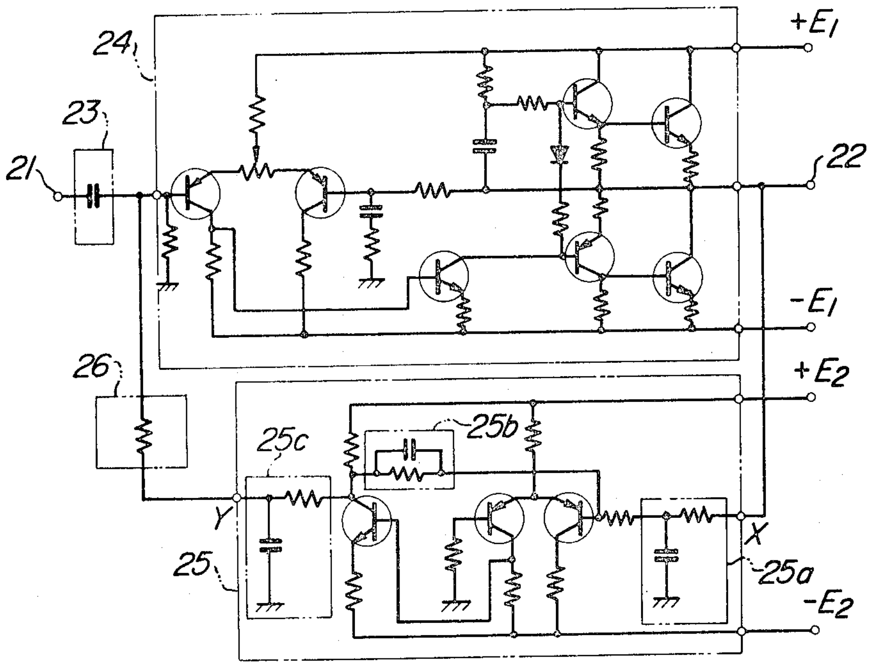
Figure 4:
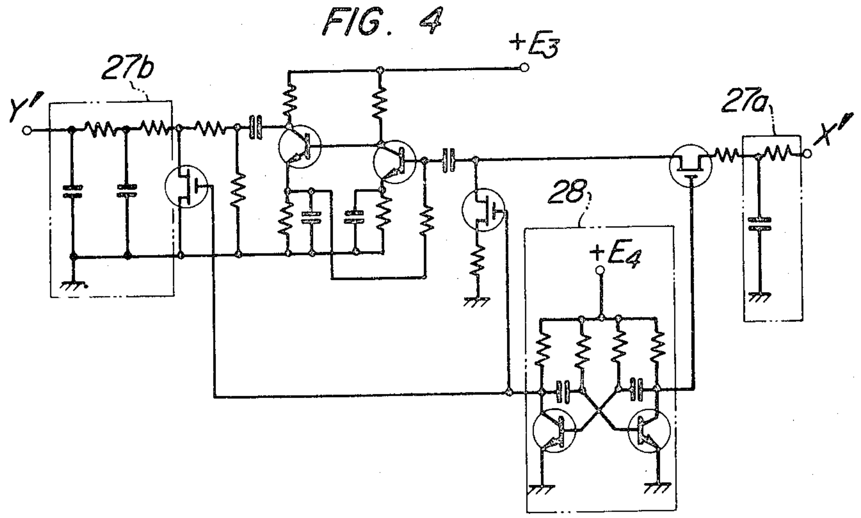

FIG. 3 is a circuit diagram showing a practical embodiment of the invention as a detailed example of the circuit of FIG. 1, and in which an all-stage direct coupling type AC amplifier is used for the AC amplifier 4 and a differential amplifier is used for the DC amplifier 5 constituting the negative feedback circuit; and FIG. 4 is a circuit diagram showing another example of the circuit of the DC amplifier 5 shown in FIG. 1, in which a chopper amplifier is used.

Figure 2:
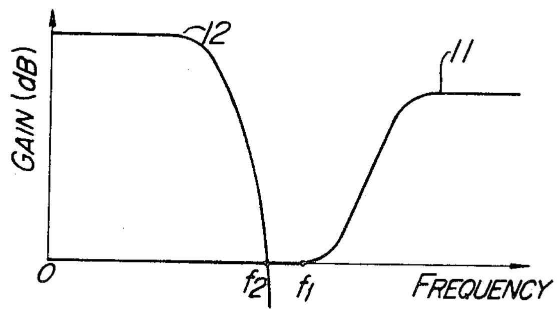
FIG. 2 is a graph showing ideal frequency characteristics of the AC amplifier 4 and DC amplifier 5 shown in FIG. 1.

The principles underlying the present invention will first be discussed with reference to FIGS. 1 and 2. Referring to FIG. 1, reference numerals 1 and 2 designate input and output terminals of an AC amplifier system respectively, to which the invention pertains. Connected to the input terminal 1 is a DC component blocking capacitor 3 whose output is connected to an AC amplifier 4. Connected to the output side of the AC amplifier 4 is a DC amplifier 5, which is provided at its input side with a filter designed to be extremely small and permitting only DC and super-low frequency components. The drift and offset in the DC amplifier 5 are extremely small compared to the AC amplifier 4. The output side of the DC amplifier 5 is connected through an element 6 serving to provide a predetermined feedback factor to the input side of the AC amplifier 4. Referring to FIG. 2, curve 11 represents the frequency characteristic of the AC amplifier 4 and curve 12 the frequency characteristic of the DC amplifier. In FIG. 2, $f_1$ designates a frequency at which the gain of the AC amplifier 4 is 0 dB, and $f_2$ designates a frequency at which the gain of the DC amplifier 5 is 0 dB. It is designed that $f_2$ is lower than $f_1$. The frequency $f_2$, which is a frequency value at which the drift and offset problems begin to arise substantially with the AC amplifier alone, is determined in dependence on the lower limit of the frequency band of the AC amplifier 4 in which the desired fidelity of reproduction can be attained, with satisfying the condition $f_2 < f_1$.

Assuming that the offset voltage and the drift voltage in the output of the amplifier system are $e$ and $\Delta e(t)$ respectively, since the voltage amplification degree of the AC amplifier 4 is 1 over a super-low frequency range lower than $f_2$ as seen from FIG. 2, the $e + \Delta e(t)$ may be expressed as $$e + \Delta e(t) = [e_1 + \Delta e_1(t) - \beta A \Delta e_2(t)]/(1 + \beta A) \quad (1)$$

where $e_1$ is the offset voltage in terms of the input to the AC amplifier 4, $\Delta e_1(t)$ is the drift voltage in terms of the input to the AC amplifier, $e_2(\equiv 0)$ is the offset voltage in terms of the input to the DC amplifier 5, $\Delta e_2(t)$ is the drift voltage in terms of the input to the DC amplifier 5, $-A$ is the voltage amplification degree and $\beta$ is the feedback factor determined by the element 6.

If the offset voltage of the AC amplifier 4 is zero, equation (1) reduces itself to $$\Delta e(t) = [\Delta e_1(t) - \beta A \Delta e_2(t)]/(1 + \beta A)$$
$$= [\Delta e_1(t)/(1 + \beta A)] - [\beta A \Delta e_2(t)/(1 + \beta A)] \quad (2)$$

If $A > 1$, equation (2) becomes $$\Delta e(t) = [\Delta e_1(t)/(1 + \beta A)] - \Delta e_2(t) \quad (3)$$

In equation (3), the drift voltage $\Delta e_2(t)$ in terms of the input to the DC amplifier 5 is extremely small compared to the drift voltage $\Delta e_1(t)$ in terms of the input to the AC amplifier 4. In practice, therefore, this means that by the provision of the feedback circuit consisting of DC amplifier 5 and element 6 the drift voltage $\Delta e_1(t)$ in the AC amplifier 4 is reduced to $\Delta e_1(t)/(1 + \beta A)$.

By way of example, assuming the drift voltage $\Delta e_1(t)$ in terms of the input to the AC amplifier 4 to be 20 millivolts, the drift voltage $\Delta e_2(t)$ in terms of the input to the DC amplifier 5 to be 0.5 millivolts, the voltage amplification degree $-A$ to be 100 and the feedback factor $\beta$ determined by the element 6 to be 0.5, the drift voltage in the output of the AC amplifier system as a whole is reduced to 0.9 millivolts.

In the AC amplifier system according to the invention, the DC amplifier 5 is responsive to a frequency range lower than $f_2$ and only the AC amplifier 4 is responsive to frequencies above $f_1$, so that the AC characteristics of the system depend upon the AC amplifier 4 and the stability in the DC and super-low frequency range can be improved through the feedback circuit of the DC amplifier 5 and element 6.

For the DC amplifier 5 constituting the negative feedback circuit satisfying the above various conditions a differential amplifier and a chopper amplifier may be used as described hereinafter in detail. Also, it is possible to vary the feedback factor by appropriately adjusting the element 6.

FIG. 3 shows an embodiment of the invention, in which the aforesaid negative feedback circuit consisting of a DC amplifier is connected to an all-stage direct coupling type AC amplifier. In FIG. 3, reference numerals 21 and 22 designate input and output terminals of the AC amplifier system, respectively. Numeral 23 designates a DC blocking capacitor inserted between the input terminal 21 and the all-stage direct coupling type AC amplifier proper generally designated at 24. Connected to the output side of the AC amplifier 24 is a differential amplifier generally designated at 25, which is designed such that the drift and offset are extremely small compared to the all-stage direct coupling type AC amplifier 24 and has filters 25a, 25b and 25c passing only DC and super-low frequency components. Connected between the output side of the differential amplifier 25 and the input side of the AC amplifier 24 is a resistor 26 serving to provide a predetermined feedback factor of negative feedback circuit including the differential amplifier 25. Reference symbols $+E_1$, $-E_1$, $+E_2$ and $-E_2$ designate stable DC sources, respectively.

By having frequencies $f_{11}$ and $f_{22}$ at which the gain of the all-stage direct coupling AC amplifier 24 and that of the differential amplifier 25 are respectively zero decibel and which satisfy a condition $f_{22}<f_{11}$ and so arranging as to have the voltage gain of the DC amplifier 25 greater than unity for a frequency range lower than $f_{22}$, the drift in the AC amplifier system may be reduced, as mentioned earlier. By so doing, it is possible to eliminate the effect of 1/f noise which increases in inverse proportion to the frequency in the super-low frequency range for the all-stage direct coupling type AC amplifier 24.

With the all-stage direct coupling type AC amplifier system shown in FIG. 3, excellent AC characteristics can be realized, and the offset and drift in the output can be greatly reduced by the provision of the feedback circuit including the differential amplifier 25. Thus, the AC amplifier system shown in FIG. 3 is most suitable for a high fidelity audio amplifier. In this case, $f_{11}$ is desirably set to lower than 1 Hz to ensure reproduction fidelity.

FIG. 4 shows another embodiment in which the DC amplifier circuit constituting the negative feedback circuit comprises a chopper amplifier including filters 27*a* and 27*b* passing only DC and super-low frequency components and an astable multivibrator 28. If this DC amplifier is to be applied to the direct coupling type AC amplifier as shown in FIG. 3, it may be connected such that points X' and Y' in FIG. 4 correspond to respective points X and Y in FIG. 3. Reference symbols $+E_3$ and $+E_4$ designate stable DC sources.

In the chopper amplifier, the drift and offset are negligibly small while providing a sufficient voltage amplification degree, so that it is effective in enhancing the DC stability of the AC amplifier. However, its circuit construction is somewhat complicated compared to the differential amplifier 25 in FIG. 3.

Since the DC amplifier constituting the negative feedback circuit need not amplify power, it can mostly be put into an integrated circuit, so that its construction can be made compact. Also, the use of a variable resistor as the element 26 in FIG. 3 permits adjusting the feedback factor of the amplifier.

As has been described in the foregoing, according to the invention it is possible to greatly reduce drift, offset and low frequency noise while ensuring excellent AC characteristics such as frequency characteristics, distortion and rated output.

What we claim is:

1. An AC amplifier system comprising an AC amplifier to amplify AC signals and a negative feedback circuit connected across said AC amplifier, said negative feedback circuit including a DC amplifier, and said DC amplifier having a cutoff frequency lower than the low cutoff frequency of said AC amplifier and being designed such that the drift and offset involved therein are extremely small compared to the drift and offset in said AC amplifier.

2. An AC amplifier system according to claim 1 wherein said DC amplifier comprises a differential amplifier.

3. An AC amplifier system according to claim 1 wherein said DC amplifier comprises a chopper amplifier.

4. An AC amplifier system according to claim 1 wherein said AC amplifier is an all-stage direct coupling type AC amplifier and said DC amplifier comprises a differential amplifier.

5. An AC amplifier system according to claim 1 wherein said AC amplifier is an all-stage direct coupling type AC amplifier and said DC amplifier comprises a chopper amplifier.

6. An AC amplifier system according to claim 1 wherein said negative feedback circuit further includes means for determining the feedback factor of said feedback circuit.

* * * * *